United States Patent
Tang et al.

(10) Patent No.: US 9,578,788 B2
(45) Date of Patent: Feb. 21, 2017

(54) INVERTER POWER MODULE PACKAGING WITH COLD PLATE

(71) Applicant: Atieva, Inc., Redwood City, CA (US)

(72) Inventors: Yifan Tang, Redwood City, CA (US); James Jan, Redwood City, CA (US); Benson Tsai, Redwood City, CA (US)

(73) Assignee: Atieva, Inc., Menlo Park, CA (US)

(*) Notice: Subject to any disclaimer, the term of this patent is extended or adjusted under 35 U.S.C. 154(b) by 331 days.

(21) Appl. No.: 14/198,329

(22) Filed: Mar. 5, 2014

(65) Prior Publication Data

US 2014/0262177 A1    Sep. 18, 2014

Related U.S. Application Data

(60) Provisional application No. 61/799,727, filed on Mar. 15, 2013.

(51) Int. Cl.
*H05K 7/20* (2006.01)
*H01L 25/11* (2006.01)
*H01L 23/473* (2006.01)
*H01H 9/52* (2006.01)

(52) U.S. Cl.
CPC ......... *H05K 7/20927* (2013.01); *H01L 23/473* (2013.01); *H01L 25/112* (2013.01); *H01H 9/52* (2013.01); *H01L 2924/0002* (2013.01); *H05K 7/20254* (2013.01)

(58) Field of Classification Search
CPC ............ H05K 7/20936; H05K 7/20254; H05K 7/1432; H01L 23/46; H01L 23/473; H01H 9/52

USPC .......... 361/699, 702; 165/80.4–80.5, 104.33, 165/169, 170; 257/714; 174/547–548; 363/141

See application file for complete search history.

(56) References Cited

U.S. PATENT DOCUMENTS

| | | | |
|---|---|---|---|
| 6,213,195 B1* | 4/2001 | Downing | H01L 23/46 165/80.4 |
| 8,004,836 B2* | 8/2011 | Kauranen | H05K 7/20918 165/80.3 |
| 8,867,210 B2* | 10/2014 | Harmelink | H05K 7/20254 165/104.33 |
| 2016/0157384 A1* | 6/2016 | Liu | H05K 7/20409 361/709 |

FOREIGN PATENT DOCUMENTS

| | | |
|---|---|---|
| JP | 2009044891 | 2/2009 |
| JP | 2009081993 | 4/2009 |
| JP | 2010010505 | 1/2010 |
| JP | 2011078217 | 4/2011 |
| JP | 2013027259 | 2/2013 |

OTHER PUBLICATIONS

International Search Report, PCT/US2014/028624, mailed Jun. 27, 2014.

* cited by examiner

*Primary Examiner* — Zachary M Pape
(74) *Attorney, Agent, or Firm* — Womble Carlyle Sandridge & Rice LLP

(57) ABSTRACT

A heat sink is provided. The heat sink includes a single-piece housing having a floor and two walls, the walls perpendicular to the floor and the walls are parallel to each other. The heat sink includes the housing having an inlet and an outlet. The housing is configured to attach power modules to an outer surface of the floor and to outer surfaces of the two walls. The housing is configured to cool the power modules in response to fluid flow into the inlet.

19 Claims, 6 Drawing Sheets

INVERTER POWER MODULE PACKAGING WITH COLD PLATE

This application claims benefit of priority from U.S. Provisional Application No. 61/799,727 filed Mar. 15, 2013, which is hereby incorporated by reference.

BACKGROUND

Packaging constraints are very tight for power modules in electric and hybrid vehicles and other applications. Power modules may need cooling during operation. Air cooling is one option to consider. Liquid cooling may be difficult due to plumbing requirements, packaging constraints, and an ever-present danger of mixing liquid and electricity. Coolant can leak from hoses or other flexible couplers joining cooling units, and cause electrical short circuits. Large, distributed cooling units with multiple such hoses and couplers may experience reduced reliability as a result.

It is within this context that the embodiments arise.

SUMMARY

In one embodiment, a heat sink is provided. The heat sink includes a single-piece housing having a floor and two walls, the walls perpendicular to the floor and the walls are parallel to each other. The heat sink includes the housing having an inlet and an outlet. The housing is configured to attach power modules to an outer surface of the floor and to outer surfaces of the two walls. The housing is configured to cool the power modules in response to fluid flow into the inlet.

In another embodiment, a power module package is provided. The package includes a first cold plate, with a first cold plate cover assembled thereto, and a first power module assembled to the first cold plate cover. The package includes a second cold plate, with a second cold plate cover assembled thereto, and a second power module assembled to the second cold plate cover, the second cold plate extending perpendicularly from an edge of the first cold plate. The package includes a third cold plate, with a third cold plate cover assembled thereto, a third power module assembled to the third cold plate cover, the third cold plate extending perpendicularly from an edge of the second cold plate, the third cold plate parallel to the first cold plate. The package includes an inner nesting region that is bounded by the first cold plate, the second cold plate and the third cold plate. The power module package is configured to cool the first power module, the second power module, the third power module and the inner nesting region of the power module package in response to a fluid flowing through the first cold plate, the second cold plate and the third cold plate.

In another embodiment, a power module package is provided. The package includes a driver module and a heat sink with a U-shaped cross-section and a chambered interior. The driver module is nested in a hollow that is partially surrounded by the heat sink and the chambered interior is configured for a fluid flow therethrough. The package includes a plurality of power modules attached to external surfaces of the heat sink.

In another embodiment, a method of cooling a three-sided power module is provided. The method includes providing a heat sink attached to a three-sided power module. The method includes flowing a coolant into an inlet of the heat sink and directing a primary flow of the coolant to cool a middle section of the three-sided power module. The method includes splitting the primary flow into a first secondary flow and a second secondary flow and directing the first secondary flow to cool a first side-section of the three-sided power module, wherein the first side-section is adjacent to the middle section and oriented at a first nonzero angle thereto, and the first secondary flow exits the first side-section via a first outlet. The method includes directing the second secondary flow to cool a second side-section of the three-sided power module, wherein the second side-section is adjacent to the middle section and oriented at a second nonzero angle thereto, and the second secondary flow exits the second side-section via a second outlet.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
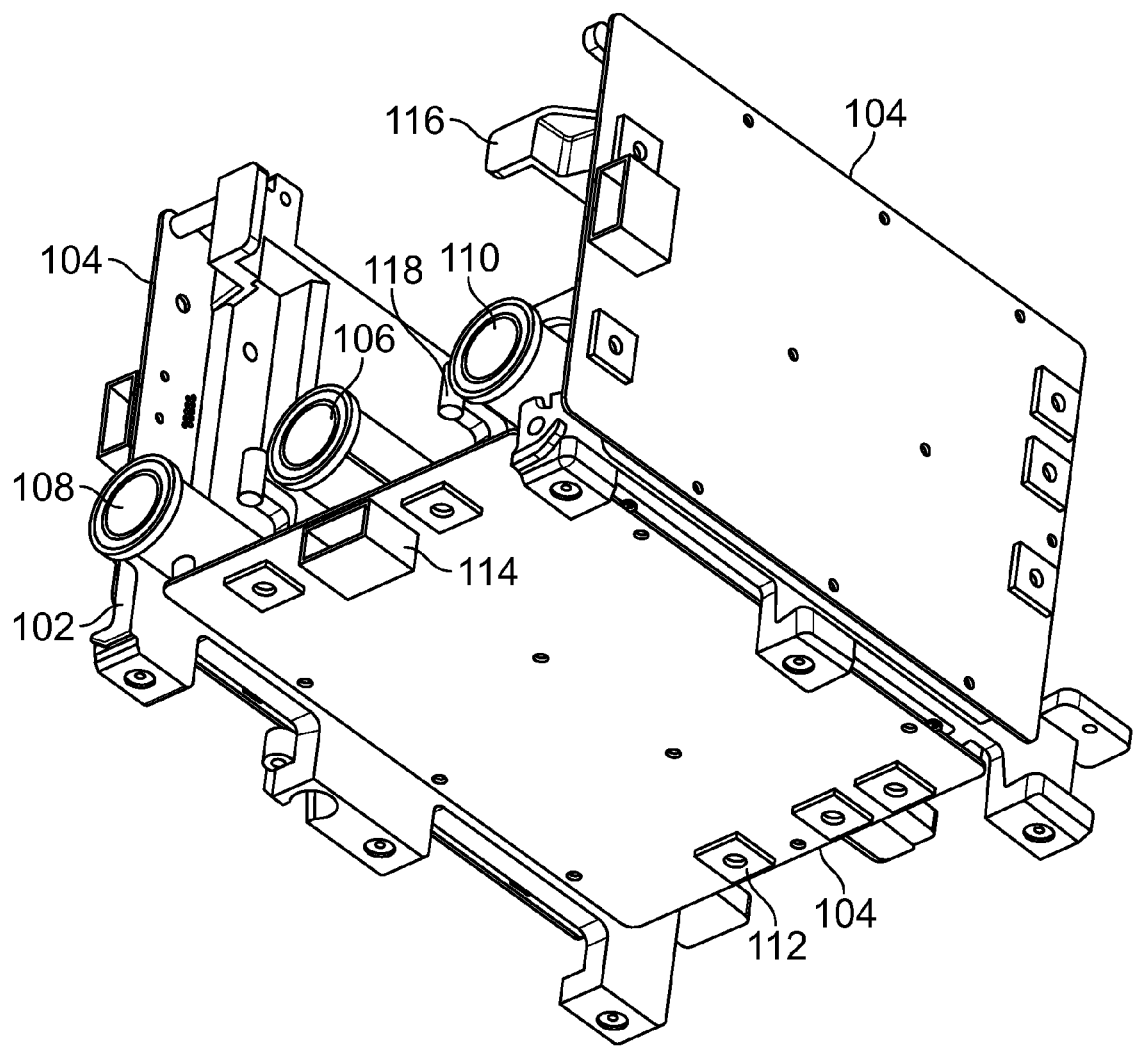
FIG. 1 is a perspective view of a power module package in accordance with some embodiments.

A power module package applies liquid cooling to power modules in an inverter for an electric or hybrid vehicle. The power module package has a fluid-filled heat sink with a U-shaped cross-section, where the fluid filled heat sink is formed by a floor and two walls. The floor and the two walls are chambered, i.e., have hollow interiors, and are each formed by a plate and a plate cover. Each of the three plates (e.g., one for the floor, two for the walls) has separators inside a chamber, with the separators guiding fluid flow through the chamber. Each of the three plate covers has inwardly pointing pin fins that immerse in the fluid in the chamber. These pin fins increase surface area contact to the fluid for better cooling. An inlet, at the center of one end of the floor, allows fluid to enter the interior of the floor. From there, the fluid flows through the floor, then splits and flows through each of the two walls. Two outlets, located at junctures of the floor and the walls in some embodiments, allow fluid to exit from the walls. Three power modules are attached as part of the power module package, one power module to each of the two walls and one more to the floor. The power modules are attached to outer surfaces of the plate covers. Each power module has power devices, for example IGBTs (integrated gate bipolar transistors), facing the cold plate cover. An inner nesting region or cavity defined within the power module package, bounded by the floor and the two walls, can hold and cool additional electronics or other assemblies.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 shows an embodiment of the power module package, with a liquid-cooled heat sink 102 and power modules 104. A liquid or fluid flows into the chambered heat sink 102 through an inlet 106, cools the various sections of the heat sink 102, and flows out through two outlets 108, 110. In the embodiment shown, three power modules 104 are attached to outer surfaces of the heat sink 102. Each of the power modules 104 has terminal connectors 112 and a driver connector 114, mounted to an outward facing surface or face of the power module 104. Here, inward and outward are relative to an interior nesting region or hollow 118 of the heat sink 102. A bracket 116 extends inwardly, i.e., towards or into the hollow 118, from one of the walls of the heat sink 102. A pulse width modulation (PWM) driver board, a digital signal processing (DSP) board, or other electronics or modules can be mounted to the bracket 116 or another bracket, so that the board or module is secured in the hollow 118 or interior nesting region of the heat sink 102. The heat sink 102 cools the power modules 104 attached to outer surfaces of the heat sink 102. The heat sink 102 also cools any board or module secured in the hollow 118, for example a driver module or a DSP module. When so mounted, the driver module can couple to each power module 104 via the driver connector 114 of the power module 104.

Figure 2:
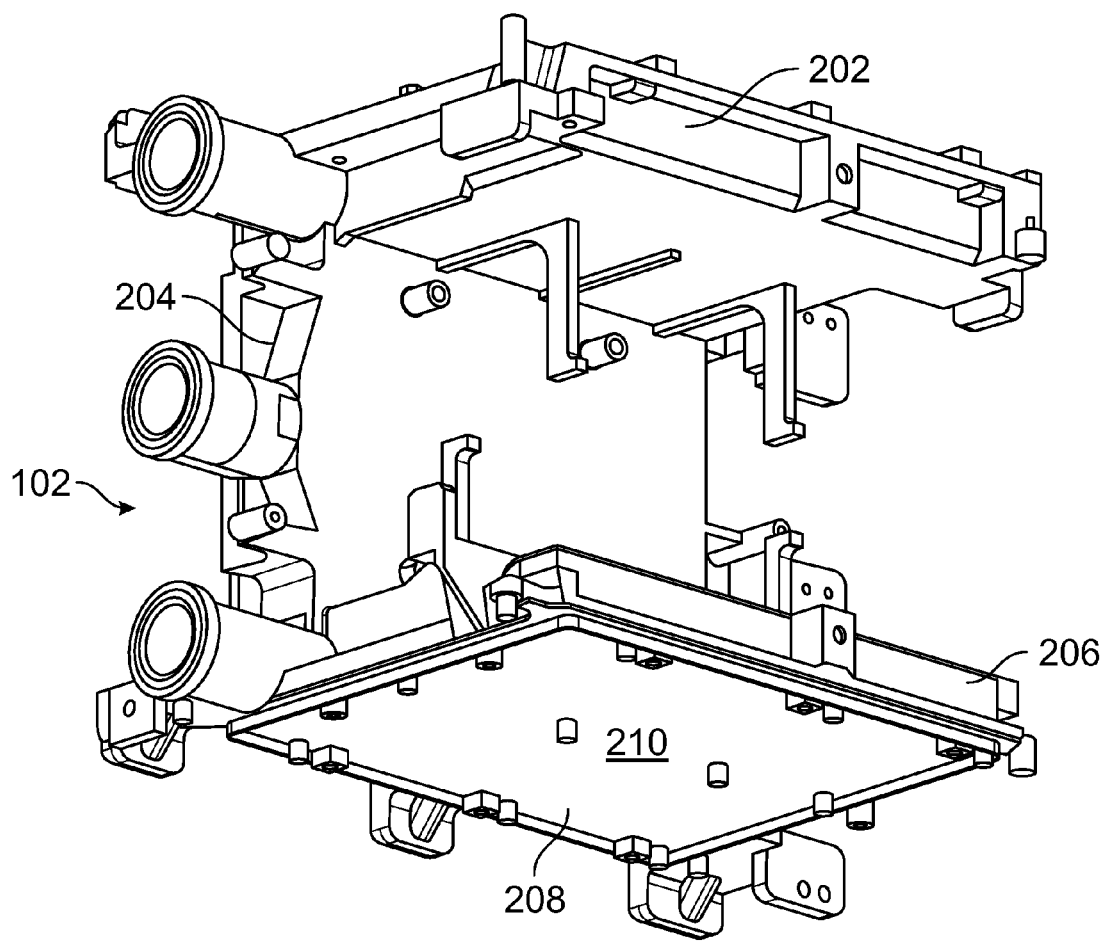
FIG. 2 is a perspective view of a heat sink from the power module package of FIG. 1 in accordance with some embodiments.

As shown in FIG. 2, the heat sink 102 includes a single-piece or monolithic housing with a U-shaped cross-section formed by a floor and two walls. The walls extend perpendicularly from opposed edges of the floor or base. Conversely, the floor extends perpendicularly from a lower edge of each wall. In the embodiment shown, each of the walls and the floor includes a cold plate 202, 204, 206 and a cold plate cover 208. A first cold plate 202 is included in a first wall section. A second cold plate 204 is included in the floor section. The second cold plate 204 is perpendicular to the first cold plate 202. A third cold plate 206 is included in a second wall section. The third cold plate 206 is perpendicular to the second cold plate 204, and parallel to the first cold plate 202. Although only one cold plate cover 208, belonging to the third cold plate 206, is shown in FIG. 2, each of the cold plates 202, 204, 206 has a respective cold plate cover 208. Referring back to FIG. 1 as well as to FIG. 2, each of the power modules 104 is attached to an outward facing surface 210 of a respective one of the cold plate covers 208. In further embodiments, the power modules and the cold plates could be oriented relative to each other at nonzero angles other than 90°. Fewer or more than three power modules and associated cold plates could be used in further embodiments. It should be appreciated that in alternative embodiments, the power modules can be encased in a thermally conductive material and then affixed to the cold plate cover.

Figure 3:
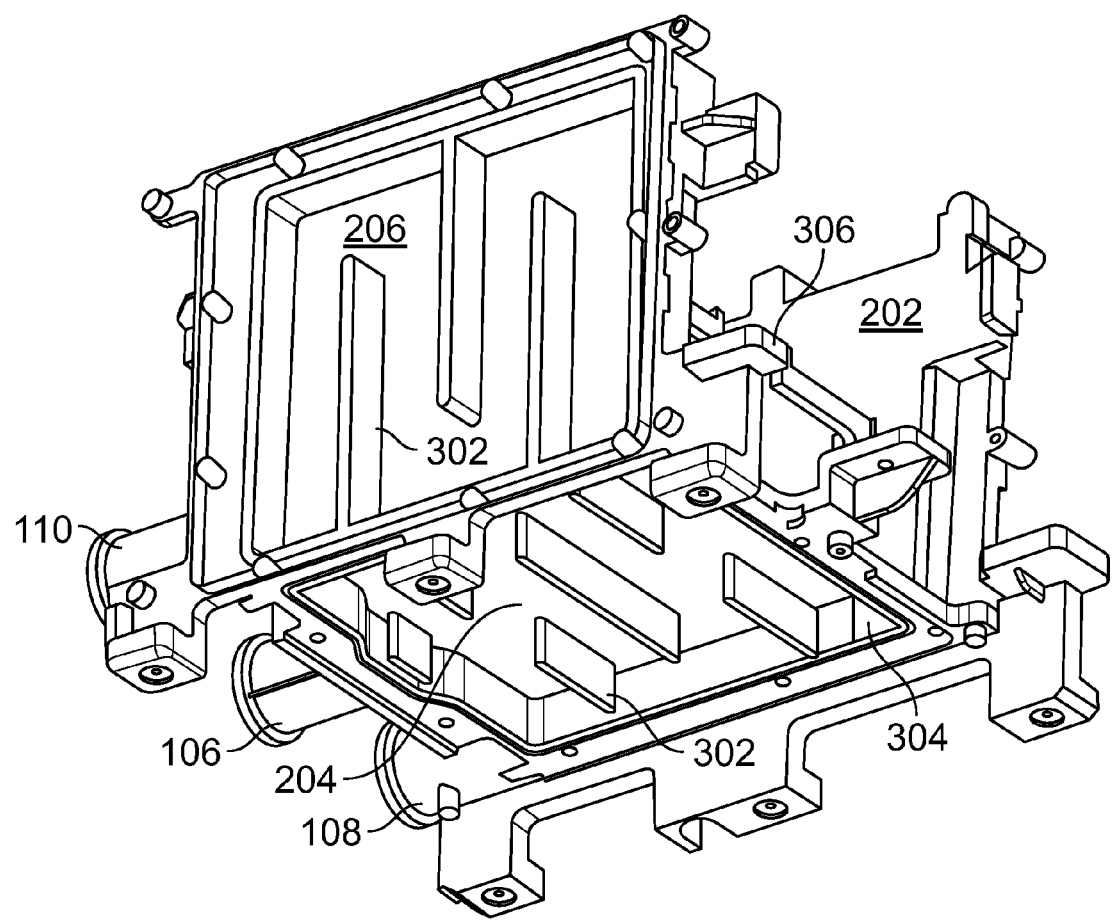
FIG. 3 is a perspective view of a cold plate housing from the heat sink of FIG. 2 in accordance with some embodiments.

FIG. 3 shows the cold plate housing, with the cold plate covers 208 removed so that features in the inner chamber or chambers of the heat sink 102 are visible. Conceptually, the heat sink 102 can be thought of as having either a single, distributed chamber, or three interconnected chambers. The chambers are in fluid communication with the inlet 106 and the outlets 108, 110. The inlet 106 is centrally located at one end of the second cold plate 204, i.e., at the middle of one end of the floor. The outlets 108, 110 are located adjacent to the inlet 106, specifically one to either side of the inlet 106, at the same end of the floor as the inlet 106. Liquid entering the heat sink 102 through the inlet 106 flows into the chamber of the second cold plate 204, i.e., into the floor of the heat sink 102. In this floor chamber, separators 302 direct or guide the flow of the liquid through the cold plate. These separators 302 thus act as liquid flow guide separators. The liquid flow splits from the floor chamber to the wall chambers, exiting the floor chamber and entering the wall chambers through respective apertures. One aperture 304 guides a portion of the liquid flow from the chamber of the second cold plate 204 to the chamber of the first cold plate 202, i.e., from the chamber of the floor to the chamber of the first wall. A similar aperture guides the remaining portion of the liquid flow from the chamber of the second cold plate 204 to the chamber of the third cold plate 206, i.e., from the chamber of the floor to the chamber of the second wall. These apertures fluidly couple interiors of the neighboring cold plates. All three of the cold plates 202, 204, 206 have liquid flow guide separators 302. Liquid exits from the walls, i.e. the first and third cold plates 202, 206, through the outlets 108, 110. One outlet 108 is located at the juncture of the first and second cold plates 202, 204. The other outlet 110 is located at the juncture of the second and third cold plates 204, 206. There is thus a continuous fluid path from the inlet 106 to interiors of each of the two walls. The interior of each wall has a continuous fluid path from the interior of the floor to the respective outlet 108, 110.

A further bracket 306 is shown in FIG. 3 extending inwardly from the first wall, i.e., extending from the first cold plate 202 towards the interior nesting region or hollow. This and other brackets can be used for mounting components, modules, etc., in the interior nesting region or hollow 118 of the heat sink 102.

Figure 4:
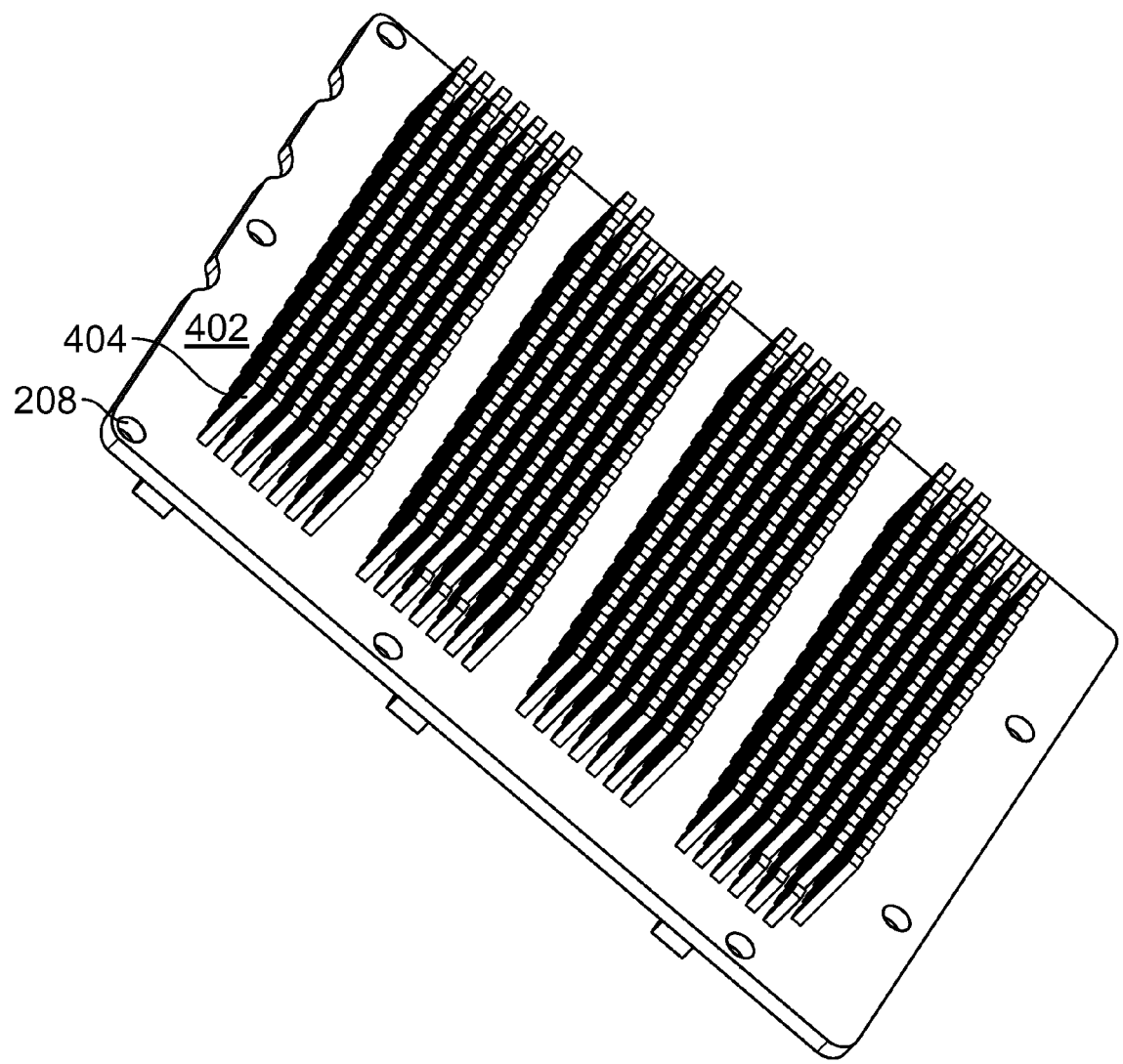
FIG. 4 is a perspective view of a cold plate cover from the heat sink of FIG. 2 in accordance with some embodiments.

One of the cold plate covers 208 is shown in FIG. 4. This could be a cold plate cover 208 for the first cold plate 202, the second cold plate 204, or the third cold plate 206. Pin fins 404 extend from an inward facing surface 402 of the cold plate cover 208. These pin fins 404 immerse in the liquid in the chamber of one of the cold plates 202, 204, 206, and present a large surface area for liquid contact and improved cooling. The inward facing surface 402 of the cold plate cover 208 opposes the outward facing surface 210 of the cold plate cover 208 shown in FIG. 2. In other words, the pin fins 404 are on the opposite face of the cold plate cover 208 from the face to which the power module 104 is attached. In the embodiment shown, the pin fins 404 are in groups that fit to either side of respective separators 302. The separators 302 guide fluid flow through the groups of pin fins 104. In further embodiments, other types of cooling fins or other protuberances can be used.

Figure 5:
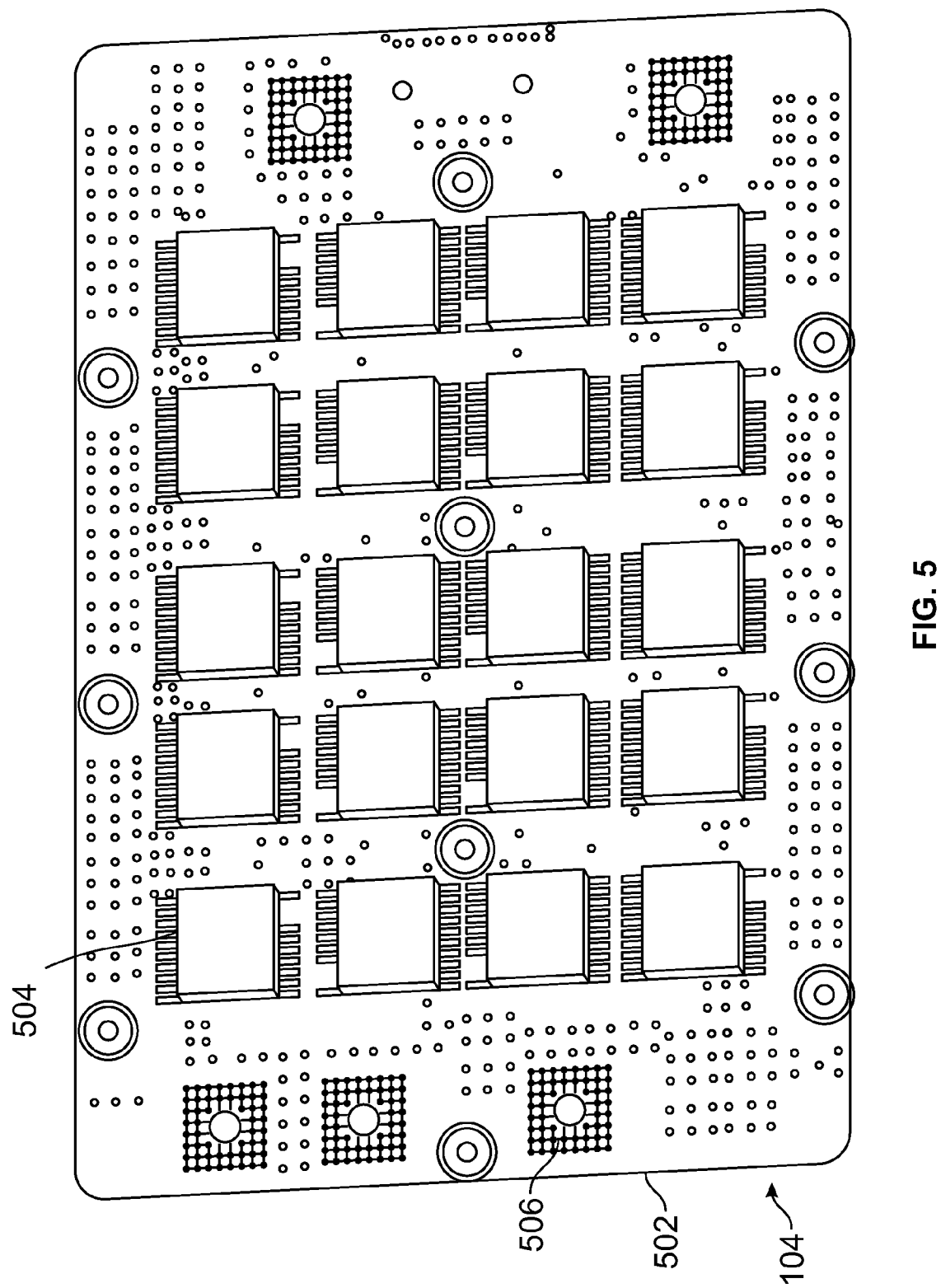
FIG. 5 is a bottom view of a power module from the power module package of FIG. 1 in accordance with some embodiments.

An inward facing surface 502 of one of the power modules 104 is shown in FIG. 5. Power devices 504 are mounted to this inward facing surface 502, so that the power devices 504 are closer to the cold plate cover 208 than the printed circuit board onto which the power devices 504 are mounted. This arrangement provides improved cooling to the power devices 504, as cooling is not impeded by the thermally insulative properties of the printed circuit board. In one embodiment, a thermal conductive compound, such as thermal grease, thermally couples the power devices 504 to the cold plate cover 208. For example, the thermally conductive compound can be applied to either the cold plate cover 208 or to the power devices 504 prior to assembly of the power module 104 to the cold plate cover 208. Soldered pins 506 of the underside of the terminal connector 112 are also visible on this inward facing surface 502 of the power module 104.

It should be appreciated that liquid flow can be provided from a pump or other suitable fluid source, which could be mechanically or electrically driven. The fluid source may provide the fluid to one or more inlets of heat sink 102. Liquid flowing through the heat sink 102 will heat up, as heat is transferred to the liquid from the power modules 104. A radiator or a heat exchanger can cool the heated liquid received from the one or more outlets of the heat sink 102. These and other known components can be applied to the above-described heat sink and power module package in a manner readily devised.

Figure 6:
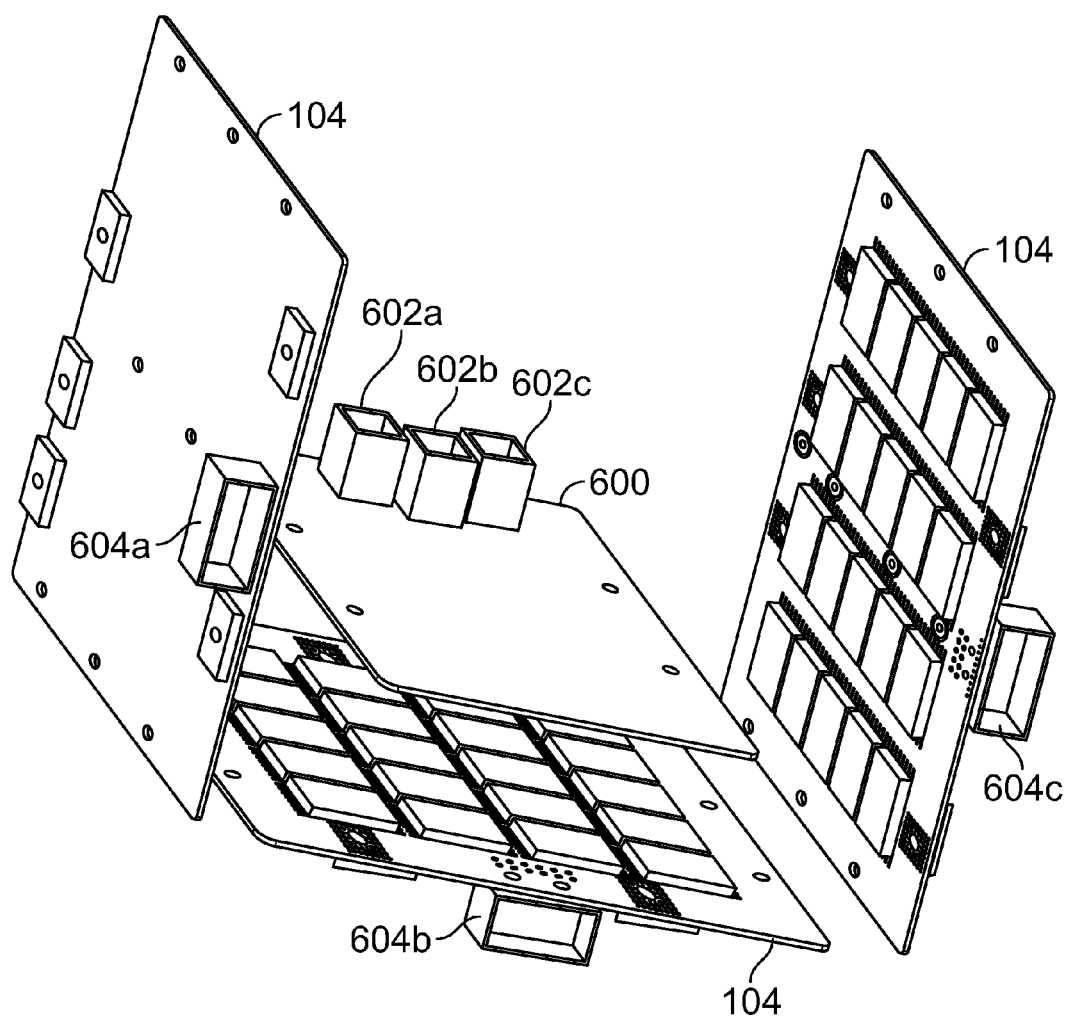
FIG. 6 is a perspective view of the positional relationship of the gate drive board disposed within the U-shaped configuration of the power modules in accordance with some embodiments.

FIG. 6 is a perspective view of the positional relationship of the gate drive board disposed within the U-shaped configuration of the power modules. Power modules 104 are illustrated in the U-shaped configuration with a gate drive board 600 nested in a cavity defined between the base and extensions of the U-shaped configuration. In some embodiments, gate drive board 600 provides signals to activate gates of power modules 104. Connectors 602a-c of gate drive board 600 provide the coupling to connectors 604a-c of power modules 104.

The embodiments described herein can be used in practicing a method of cooling a multi-sided or three-sided power module. For example, the three power modules can be assembled into a three-sided power module, and a heat sink can be provided that is attached to the three-sided power module. In an action, a coolant is flowed into an inlet of the heat sink. The primary flow of the coolant is directed to cool a middle section of the three-sided power module as described above in FIGS. 1-6. For example, the coolant is directed to cool the second cold plate and the attached power module. The primary coolant flow is split into a first secondary flow and a second secondary flow in some embodiments. The first secondary flow is directed to cool a first side-section of the three-sided power module. For example, the first secondary flow is directed to cool the first cold plate and the attached power module. The first secondary flow exits the first side-section via a first outlet. The second secondary flow is directed to cool a second side-section of the three-sided power module. For example, the second secondary flow is directed to cool the third cold plate and the attached power module. The second secondary flow exits the second side-section via a second outlet. In this example, the first side-section is adjacent to the middle section and is oriented at nonzero angle relative to that section. The second side-section is adjacent to the middle section and oriented at a nonzero angle relative to that section. In some embodiments, the first and second side sections are orthogonal to a surface of the middle section in a U-shaped configuration and power modules coupled to a gate drive board or boards are nested in a cavity defined between the base and side extensions of the U-shaped configuration.

In a further action, a driver module is cooled via the primary flow, the first secondary flow and the second secondary flow. For example, the driver module can be coupled to the three-sided power module. The driver module can be nested in a hollow of the heat sink. The driver module can be partially surrounded by the three-sided power module.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A power module package, comprising:
   a first cold plate, with a first cold plate cover assembled thereto, and a first power module assembled to the first cold plate cover;
   a second cold plate, with a second cold plate cover assembled thereto, and a second power module assembled to the second cold plate cover, the second cold plate extending perpendicularly from an edge of the first cold plate; and
   a third cold plate, with a third cold plate cover assembled thereto, a third power module assembled to the third cold plate cover, the third cold plate extending perpendicularly from an edge of the second cold plate, the third cold plate parallel to the first cold plate;
   an inner nesting region of the power module package, bounded by the first cold plate, the second cold plate and the third cold plate, the power module package configured to cool the first power module, the second power module, the third power module and the inner nesting region of the power module package in response to a fluid flowing through the first cold plate, the second cold plate and the third cold plate;
a first outlet, located at a juncture of the first cold plate and the second cold plate, the first outlet configured to flow the fluid out from the first cold plate; and
a second outlet, located at a juncture of the second cold plate and the third cold plate, the second outlet configured to flow the fluid out from the third cold plate.

2. The power module package of claim 1, further comprising:
each of the first cold plate cover, the second cold plate cover and the third cold plate cover having pin fins, the pin fins configured to immerse in the fluid.

3. The power module package of claim 1, further comprising:
each of the first power module, the second power module and the third power module having power devices facing the first cold plate cover, the second cold plate cover and the third cold plate cover, respectively.

4. The power module package of claim 1, further comprising:
a thermal conductive compound thermally coupling the first power module to the first cold plate cover, the second power module to the second cold plate cover, and the third power module to the third cold plate cover.

5. The power module package of claim 1, further comprising:
an inlet, centrally located at one end of the second cold plate, the inlet configured to flow the fluid into the second cold plate.

6. The power module package of claim 1, further comprising:
separators attached to the first cold plate, the second cold plate and the third cold plate, the separators configured to guide the fluid through the first cold plate, the second cold plate and the third cold plate.

7. The power module package of claim 1, further comprising:
the first cold plate having an aperture that fluidly couples an interior of the first cold plate to an interior of the second cold plate; and
the third cold plate having a further aperture that fluidly couples an interior of the third cold plate to the interior of the second cold plate.

8. A power module package, comprising:
a first cold plate, a second cold plate, and a third cold plate, each having a cold plate cover and a power module;
the first cold plate and the third cold plate arranged at opposed edges of the second cold plate and perpendicular to the second cold plate so as to bound an inner nesting region of the power module package; and
the first cold plate, the second cold plate and the third cold plate configured to flow a fluid therethrough so as to cool the first power module, the second power module, the third power module and the inner nesting region, wherein the fluid path enters the second cold plate and splits to the first cold plate and the third cold plate.

9. The power module package of claim 8, further comprising:
the cold plate cover of each of the first cold plate, the second cold plate and the third cold plate having a plurality of pin fins arranged to contact the fluid.

10. The power module package of claim 8, further comprising:
a plurality of power devices arranged to face the cold plate cover, on each of the first power module, the second power module and the third power module.

11. The power module package of claim 8, further comprising:
the cold plate cover of each of the first cold plate, the second cold plate and the third cold plate having a thermal conductive compound to couple to the power module.

12. The power module package of claim 8, further comprising:
the second cold plate having an inlet for receiving the fluid; and
each of the first and third cold plates configured to receive the fluid from the second cold plate.

13. The power module package of claim 8, further comprising:
a juncture of the first and second cold plates having a first outlet for discharging the fluid; and
a juncture of the third and second cold plates having a second outlet for discharging the fluid.

14. The power module package of claim 8, further comprising:
each of the first cold plate, the second cold plate and the third cold plate having separators configured to guide the fluid through the second cold plate to the first cold plate and the third cold plate, and through the first cold plate and the third cold plate.

15. A power module package, comprising:
a first cold plate having a first cold plate cover and a first power module;
a second cold plate having a second cold plate cover and a second power module;
a third cold plate having a third cold plate cover and a third power module; and
the first cold plate and the third cold plate monolithic with and perpendicular to the second cold plate and bounding an inner nesting region of the power module package, with a fluid path through the second cold plate and each of the first cold plate and the third cold plate, wherein the fluid path enters the second cold plate and splits to the first cold plate and the third cold plate.

16. The power module package of claim 15, further comprising:
the second cold plate having an inlet for the fluid path;
a juncture between the first cold plate and the second plate having an outlet for the fluid path; and
a further juncture between the third cold plate and the second cold plate having a further outlet for the fluid path.

17. The power module package of claim 15, further comprising:
the first cold plate cover having a first plurality of pin fins;
the second cold plate cover having a second plurality of pin fins; and
the third cold plate cover having a third plurality of pin fins.

18. The power module package of claim 15, further comprising:
the first cold plate having a first plurality of separators;
the second cold plate having a second plurality of separators; and
the third cold plate having a third plurality of separators, each of the first, second and third plurality of separators configured to guide fluid along the fluid path.

19. The power module package of claim 15, wherein the first cold plate and the third cold plate monolithic with and perpendicular to the second cold plate has a U-shaped cross-section bounded by the first cold plate, the second cold plate and the third cold plate.

* * * * *